United States Patent [19]

Jove et al.

[11] Patent Number: 4,743,861

[45] Date of Patent: May 10, 1988

[54] FREQUENCY RESPONSE COMPENSATION CIRCUIT

[75] Inventors: Stephen A. Jove, Watsonville; Klaas B. Klaassen, San Jose; Jacobus C. L. VanPeppen, San Jose; Chon N. Vo, San Jose, all of Calif.

[73] Assignee: International Business Machines Corporation, Armonk, N.Y.

[21] Appl. No.: 923,777

[22] Filed: Oct. 27, 1986

[51] Int. Cl.$^4$ .................... H03F 3/45; H03G 3/30
[52] U.S. Cl. ................................. 330/260; 330/278
[58] Field of Search ............... 330/254, 260, 278, 282

[56] References Cited

U.S. PATENT DOCUMENTS 4,651,210  3/1987  Olson ................................. 330/260

Primary Examiner—Gene Wan
Attorney, Agent, or Firm—Thomas R. Berthold

[57] ABSTRACT

A frequency response compensation circuit includes a first forward gain stage and second reverse gain stage coupled to the first stage in negative feedback mode. The reverse gain stage depresses the gain of the first stage at low frequencies. When the frequency response of the reverse gain stage begins degrading, which corresponds to the frequency of the real zero of the compensation circuit, the gain of the compensation circuit begins increasing and increases until the gain of the reverse stage is zero. The circuit utilizes a pair of NPN transistors in the first stage, a pair of PNP transistors in the second stage and includes no capacitors or inductors. Thus, the circuit can be implemented as a semiconductor integrated circuit. By proper selection of the resistance values of the resistors in the circuit, the zero of the compensation circuit can be chosen to correspond generally to the frequency of the pole of the uncompensated input signal, so as to increase the bandwidth of the resultant signal. Multiple reverse gain stages can be included, with a selected reverse gain stage switched into connection with the first stage, so as to provide, generally, a constant frequency response for different input signals having different frequency responses.

2 Claims, 2 Drawing Sheets

FREQUENCY RESPONSE COMPENSATION CIRCUIT

TECHNICAL FIELD

This invention relates to circuits for compensating the frequency response of an electronic system, and more particularly to such circuits capable of implementation as semiconductor integrated circuits.

BACKGROUND OF THE INVENTION

In specific circuit applications it is often necessary to correct the frequency response of a particular system. Circuits for accomplishing such frequency response compensation are well known, and typically involve the use of capacitors and inductors. For example, phase lead and lag networks employing operational amplifiers with passive element negative feedback configurations are known, as described in *Handbook of Operational Amplifier Applications*, Burr-Brown Research Corp., First Edition, 1963. However, because such circuits require the use of capacitors and inductors, they cannot be used in applications where it is necessary or desirable to implement the entire circuit into integrated technology.

In addition, in certain applications the electronic system may in fact comprise several different systems, each having a different frequency response. For example, in magnetic recording disk files, the read/write channel may be connected to a multiple number of separate preamplifiers, each of which amplifies the signal from an associated read/write transducer. Because of variations in the individual transducers, as well as variations in the length of the electrical leads from the transducer to the read/write channel, the output of each preamplifier will typically have a frequency response different than that of the other preamplifiers. Thus, it is desirable to utilize a single frequency response compensator formed in integrated circuit format which is capable of compensating these different frequency responses.

SUMMARY OF THE INVENTION

The present invention is a frequency response compensator comprising a first forward gain stage and a second reverse gain stage coupled to the forward gain stage in negative feedback mode. The forward gain stage includes a current source, resistors and NPN transistors, and the reverse gain stage includes a current source, resistors and PNP transistors. Because the compensator utilizes no capacitors or inductors, it can be implemented as a semiconductor integrated circuit.

The reverse gain stage decreases the gain of the forward gain stage at low frequencies. The reverse gain stage has a degenerated high frequency response and is designed such that the gain of the compensator begins increasing at approximately that frequency at which the gain of the uncompensated electronic system begins decreasing. The frequencies of the zero and pole of the compensator are functions of, among other things, the transition frequency of the PNP transistors in the reverse gain stage. By proper selection of the values of the resistors in the compensator, the frequency of the zero of the compensator may be selected to occur at approximately the same frequency as the pole of the uncompensated electronic system, so as to extend the frequency response of the resultant system.

Because the compensator can be fabricated in integrated circuit format, it is possible to form multiple reverse gain stages on the same semiconductor chip. Thus, different uncompensated systems, each with its own frequency response, can be compensated by switching in different current sources for the reverse gain stages. The resistance values of the emitter resistors in the different reverse gain stages are selected such that the gain of the compensator remains the same when the different reverse gain stages are switched in to compensate these different systems.

For a fuller understanding of the nature and advantages of the present invention reference should be made to the following description taken in conjunction with the accompanying drawings.

DESCRIPTION OF THE PREFERRED EMBODIMENTS

Figure 1:
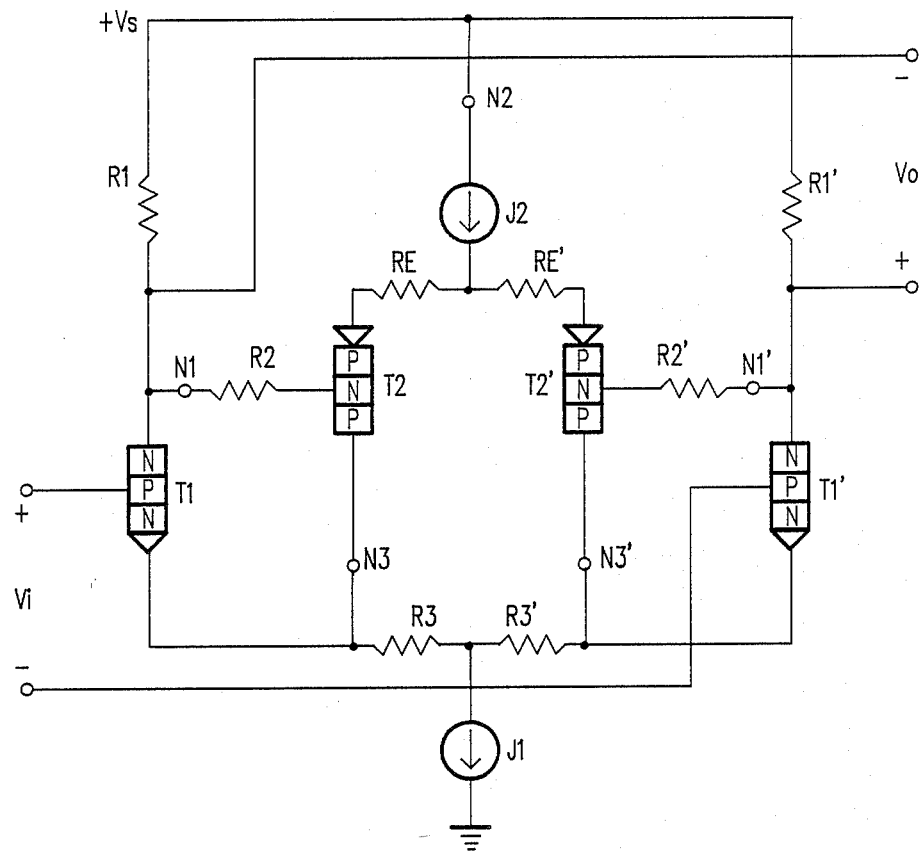
FIG. 1 is a circuit diagram for the frequency response compensator illustrating the forward gain and reverse gain stages.

The frequency response compensation circuit of the present invention is illustrated in FIG. 1, wherein the electronic system whose frequency response is to be compensated is represented as the input $V_i$ to the compensator, and the output from the compensator is represented as $V_o$. The first stage of the compensator is a forward gain stage and includes NPN transistors T1, T1'; NPN collector resistors R1, R1'; NPN emitter resistors R3, R3'; and current source J1. The second or reverse gain stage is connected to the forward gain stage at nodes N1, N1', N2, N3, and N3'. The reverse gain stage includes PNP transistors T2, T2'; resistors R2 and R2'; PNP emitter resistors RE and RE' and current source J2. Because no capacitors or inductors are used with the compensator of FIG. 1, the compensator can be implemented in integrated circuit format.

Figure 2:
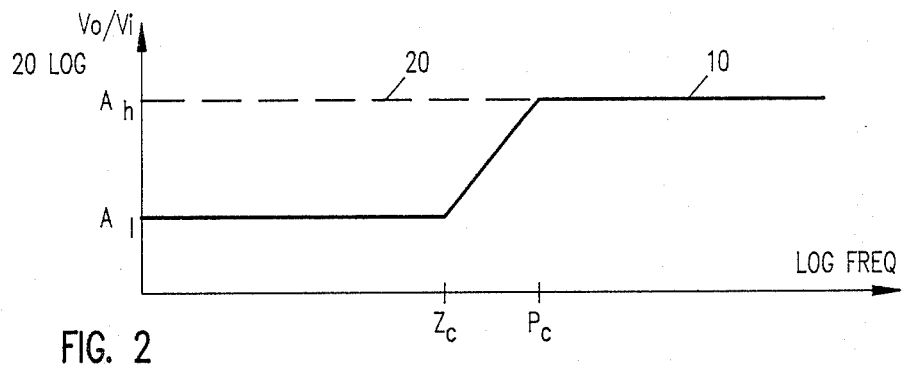
FIG. 2 is an asymptotic Bode diagram illustrating the frequency response of the compensator, and the first stage of the compensator in the absence of the second stage.

The asymptotic Bode diagram of the frequency response compensator is illustrated as solid line 10 in FIG. 2. The reverse gain stage is used to decrease the gain of the forward gain stage at low frequencies. Because of the presence of the two PNP transistors, the series base resistors R2 and R2' and emitter resistors RE and RE', the reverse gain stage has a degenerated high frequency response. The result of the combination of the forward gain stage and reverse gain stage is that the real zero of the compensator ($Z_c$) occurs at a lower frequency than the real pole of the compensator ($P_c$). The low frequency gain is $A_l$ and the high frequency gain $A_h$. That portion of the compensator frequency response where the gain is $A_l$ is the frequency range over which the negative feedback from the second stage depresses the gain of the first stage. At $Z_c$ the frequency response of the second stage begins degrading and thus the effect of the feedback on the first stage begins to lessen. The frequency $P_c$ is determined by the product of the zero, $Z_c$, and the d.c. loop gain $A_h/A_l$. That portion of the compensator frequency response where the gain is $A_h$ is where the gain is due mainly to the first stage. Dashed line 20 in FIG. 2 represents the frequency response the compensator would exhibit if the reverse gain stage were not present in the circuit of FIG. 1.

The following equations (1) through (4) express the frequencies of the compensator pole and zero and the gain at low and high frequencies as functions of the parameters of the circuit elements shown in FIG. 1, where $RE=RE'$, $R1=R1'$, $R2=R2'$ and $R3=R3'$, and it is assumed that the d.c. loop gain is much greater than 1.

$$P_c = \frac{\{(R2 + R1)/Bp\}(R3 + rE) + R1 \cdot R3}{(R1 + R2 + RE)(rE + R3)} \cdot Ft_{PNP} \quad (1)$$

$$Z_c = \frac{(R2/Bp) + RE}{R2 + RE} \cdot Ft_{PNP} \quad (2)$$

$$A_l = \frac{R1(R2 + RE \cdot Bp)}{(R1 + R2 + RE \cdot Bp)(rE + R3) + R1 \cdot R3 \cdot Bp} \quad (3)$$

$$A_h = A_l \cdot (P_c/Z_c) \quad (4)$$

The following definitions apply to equations (1) through (4):

$rE$ = differential emitter resistances of the *NPN* transistors,
 = $(kT/q\ Ic1) = (J1 - J2)/2$, Ic1 = collector current of the NPN transistors, $re$ = differential emitter resistances of the *PNP* transistors,
 = $(kT/q\ Ic2) = J2/2$, Ic2 = collector current of the PNP transistors,
k = Boltzmann's constant,
T = absolute temperature,
q = electron charge,
Bp = forward current gain of the PNP transistors, and
$Ft_{PNP}$ = transition frequency of the PNP transistors.

Equations (1) through (4) have been simplified by assuming that $Ft_{PNP}$ is much less than the transition frequency of the NPN transistors, and that re is much less than RE. In addition, the base spreading resistance of the PNP transistors T2 and T2' has been included in the values for R2 and R2'.

By referring to equations (1) through (4), it will be noted that $A_l$, $Z_c$ and $P_c$ can be selected by proper selection of resistance values and $Ft_{PNP}$. The selection of $A_l$ results in the setting of $A_h$.

Figure 3A:
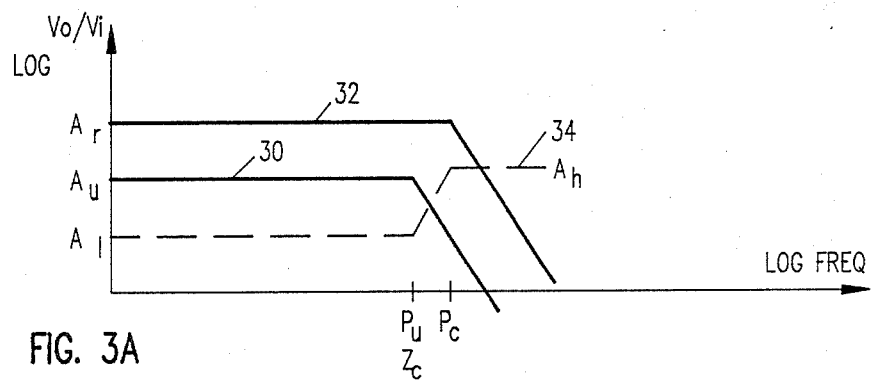
FIG. 3A is an asymptotic Bode diagram illustrating the resultant frequency response when the frequency of the compensator zero is at the same frequency as the pole of the uncompensated system.

Referring now to FIG. 3A, the frequency response of an uncompensated system, represented as line 30 with low frequency gain $A_u$, is desired to be corrected to increase its bandwidth so as to give a resultant frequency response, represented as line 32. As shown in FIG. 3A, if the frequency of the compensator zero ($Z_c$) is at the same frequency as the pole of the uncompensated electronic system ($P_u$), the bandwidth of the electronic system is extended, with a flat frequency response $A_r$, to the pole of the compensator ($P_c$). The frequency response of the compensator is designated as line 34.

Figure 3B:
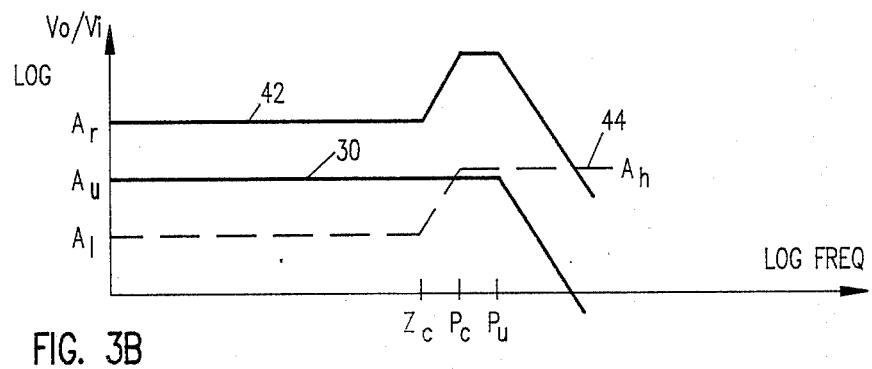
FIG. 3B is an asymptotic Bode diagram illustrating a peaking of the gain of the resultant signal if the frequency of the compensator zero occurs before the frequency of the pole of the uncompensated system.

If it is desired to provide a peak gain over a particular frequency range, then the resistor values in the circuit of FIG. 1 can be selected such that $Z_c$ occurs before $P_u$. Thus, as shown in FIG. 3B, the frequency response 44 of the compensator causes the uncompensated frequency response 30 to be modified to generate a peak gain in the resultant frequency response 42 at a frequency beyond $Z_c$. The amount of peaking is limited to the difference between $A_l$ and $A_h$ (FIG. 2), which is defined by the selection of resistor values in the compensator.

Figure 3C:
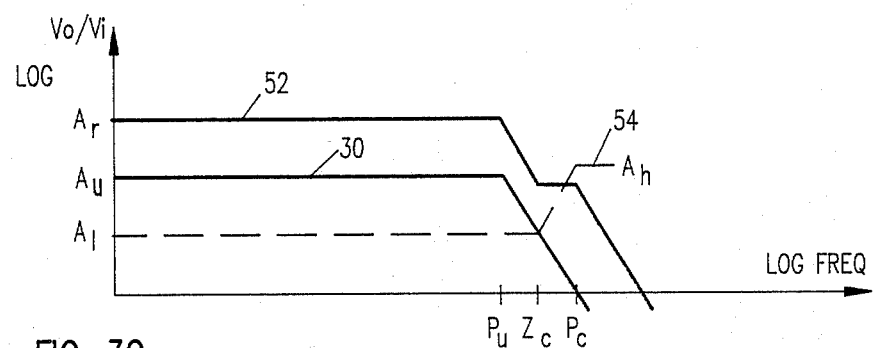
FIG. 3C is an asymptotic Bode diagram illustrating the resultant frequency response if the compensator zero occurs after the pole of the uncompensated system.

Referring to FIG. 3C, the resultant frequency response will be as shown by line 52 if $Z_c$ of the compensator's frequency response 54 is greater than $P_u$. Assuming that $Z_c$ is not too much greater than $P_u$, the resultant bandwidth will be greater than the uncompensated bandwidth.

Referring again to FIG. 1, nodes N1, N1', N2, N3 and N3' are common nodes separating the forward gain stage from a number of selectable reverse gain stages, only one of which is shown in FIG. 1. Thus, it is possible to vary the bandwidth of the resultant system by selecting the proper reverse gain stage. The reverse gain stages can be selected by switching in the appropriate current from the current source J2 associated with each reverse gain stage. Thus, if the compensator of FIG. 1 having multiple reverse gain stages is connected to several input systems having different frequency response characteristics, then an identical compensated frequency response for each input can be achieved by selecting the appropriate reverse gain stage. Thus the compensator of the present invention has specific application for connection to different input preamplifiers, each having its own unique frequency response, for creating a resultant frequency response which is the same for each input. In addition, if the compensator having multiple reverse gain stages connected to the common nodes is connected to an electronic system with a single frequency response, then different frequency response outputs can be achieved by selecting an appropriate reverse gain stage.

In the embodiment having multiple reverse gain stages, each pair of PNP transistors will have associated with it a unique emitter current and base resistances. Thus, when different reverse gain stages are selected the compensator may have different gains. However, by proper selection of RE and RE' (FIG. 1) the difference in compensator gain when different reverse gain stages are selected can be eliminated so that the compensator has the same gain, regardless of which reverse gain stage is selected.

While the preferred embodiments of the present invention have been illustrated in detail, it should be apparent that modifications and adaptations to those embodiments may occur to one skilled in the art without departing from the scope of the present invention as set forth in the following claims.

What is claimed is:

1. A circuit, having no reactive elements, for the compensation of the frequency response of an input signal having a high frequency roll off comprising:

a forward gain stage having a generally flat frequency response over a range extending beyond the high frequency roll off of the input signal and comprising a pair of NPN transistors, a pair of collector resistors, a pair of emitter resistors and a first current source connected between the emitter resistors; and a reverse gain stage coupled to the forward gain stage in negative feedback mode and comprising a pair of PNP transistors, a pair of emitter resistors, a pair of base resistors and a second current source connected between the reverse gain stage emitter resistors, said PNP transistors having a transition frequency value and said second stage resistors having resistance values defining the high frequency roll off of said reverse gain stage as approximately equal to the high frequency roll off of the input signal;

whereby the gain of said forward gain stage is depressed by said coupled reverse gain stage at frequencies below the high frequency roll off of the input signal and the bandwidth of the signal at the output of the compensation circuit is thereby increased with respect to the bandwidth of the input signal.

2. The circuit according to claim 1 wherein the circuit compensates for the frequency responses of multiple input signals, each input signal having a predetermined high frequency roll off, and further comprising multiple reverse gain stages, each of said reverse gain stages having PNP transistors with a transition frequency value and resistors with resistance values defining the high frequency roll off of said each reverse gain stage as approximately equal to the high frequency roll off of a corresponding input signal, and means for selectively connecting each of said multiple reverse gain stages to the forward gain stage in response to the selection of the corresponding input signal.

* * * * *